(12) United States Patent
Tsuchi

(10) Patent No.: US 10,210,838 B2
(45) Date of Patent: Feb. 19, 2019

(54) VOLTAGE LEVEL SHIFTING METHOD

(71) Applicant: Renesas Electronics Corporation, Tokyo (JP)

(72) Inventor: Hiroshi Tsuchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 12 days.

(21) Appl. No.: 15/644,113

(22) Filed: Jul. 7, 2017

(65) Prior Publication Data

US 2017/0316752 A1 Nov. 2, 2017

Related U.S. Application Data

(63) Continuation of application No. 14/884,995, filed on Oct. 16, 2015, now Pat. No. 9,721,526, which is a (Continued)

(30) Foreign Application Priority Data

Dec. 8, 2010 (JP) .................................. 2010-273562

(51) Int. Cl.
*G09G 3/36* (2006.01)
*H03K 3/356* (2006.01)
(Continued)

(52) U.S. Cl.
CPC ......... *G09G 3/3696* (2013.01); *G09G 3/3258* (2013.01); *G09G 5/00* (2013.01);
(Continued)

(58) Field of Classification Search
CPC ... G09G 2300/0838; G09G 2300/0871; G09G 2310/0289; G09G 2310/3283–2310/3291; G09G 2310/3685–2310/3696
See application file for complete search history.

(56) References Cited

U.S. PATENT DOCUMENTS

| | | | |
|---|---|---|---|
| 5,995,010 A | 11/1999 | Blake et al. | |
| 6,331,797 B1 * | 12/2001 | Lambert | ................ H03K 3/012 326/68 |
| 6,437,627 B1 | 8/2002 | Tran et al. | |
| 6,842,043 B1 | 1/2005 | Nguyen et al. | |
| 7,872,499 B2 | 1/2011 | Tsuchi | |
| 7,884,646 B1 | 2/2011 | Bourstein | |
| 7,994,821 B1 | 8/2011 | Wang et al. | |
| 2001/0013795 A1 | 8/2001 | Nojiri | |

(Continued)

FOREIGN PATENT DOCUMENTS

JP 2009-188734 8/2009

OTHER PUBLICATIONS

G. Kovacs, EE113 Course Notes Electronic Circuits from Stanford University—EE113 Lecture, 1997, p. 201 http://www.stanford.edu/class/ee122/Handouts/EE 113_ Course_Notes_RevO.pdf.

*Primary Examiner* — Sanghyuk Park
(74) *Attorney, Agent, or Firm* — Young & Thompson

(57) ABSTRACT

A level shift circuit includes first and second NMOS transistors that are coupled between a first supply terminal, and first and second output nodes, respectively, and have respective control terminals receiving input signals of a low amplitude, third and fourth PMOS transistors which are coupled between a second supply terminal, and the first and second output nodes outputting signals of high amplitude, respectively, a fifth PMOS transistor which is coupled between a gate of the third PMOS transistor and the second output node, and has a gate coupled to the first output node, a sixth PMOS transistor which is coupled between a gate of the fourth PMOS transistor and the first output node, and has a gate coupled to the second output node, and first and second load elements which are coupled between the second supply terminal and the gates of the third and fourth PMOS transistors, respectively.

9 Claims, 11 Drawing Sheets

Related U.S. Application Data continuation of application No. 14/526,958, filed on Oct. 29, 2014, now Pat. No. 9,183,808, which is a continuation of application No. 13/304,433, filed on Nov. 25, 2011, now Pat. No. 8,890,789.

(51) Int. Cl.
*G09G 5/00* (2006.01)
*H03K 19/0175* (2006.01)
*G09G 3/3258* (2016.01)

(52) U.S. Cl.
CPC ... *H03K 3/356165* (2013.01); *H03K 19/0175* (2013.01); *G09G 2310/027* (2013.01); *G09G 2310/0289* (2013.01)

(56) References Cited

U.S. PATENT DOCUMENTS

| | | |
|---|---|---|
| 2002/0118159 A1 | 8/2002 | Azami |
| 2004/0257327 A1* | 12/2004 | Ker ............... H03K 3/012 345/100 |
| 2005/0057556 A1* | 3/2005 | Kubota ............ G09G 3/3677 345/211 |
| 2005/0258886 A1 | 11/2005 | Hirano |
| 2005/0275389 A1 | 12/2005 | Cordoba |
| 2006/0044888 A1 | 3/2006 | Kim et al. |
| 2007/0242027 A1 | 10/2007 | Ueda |
| 2007/0247209 A1 | 10/2007 | Chen |
| 2008/0074148 A1 | 3/2008 | Srivastava et al. |
| 2008/0238522 A1 | 10/2008 | Thorp et al. |

* cited by examiner

VOLTAGE LEVEL SHIFTING METHOD

BACKGROUND

The present invention relates to a level shift circuit and a driver circuit having the level shift circuit.

In recent years, displays using various display devices such as displays using liquid crystal display devices or organic EL elements have been developed in a field of the display devices. A higher quality (multi-grayscale) has been demanded for those display devices, and there is a tendency that a voltage amplitude of a scanning signal or a grayscale signal becomes increased. For that reason, higher voltage has been required for the respective output parts of a row driver that drives scanning lines of a display panel, and a column driver that drives data lines of the display panel according to the grayscale signal.

On the other hand, various control signals and a video data signal, which are supplied from a display controller to the row driver (scanning driver) and the column driver (data driver), need high-speed transfer and low EMI (electromagnetic interference) with the use of a small number of wirings. Those signals are being lowered in voltage amplitude. Similarly, in the interiors of the row driver and the column driver, in order to suppress an increase in the area (increase in the costs) of a logic circuit that processes data of the amount increased attributable to higher definition and higher number of multi-grayscale, a fine process is applied with the result that a tendency that a supply voltage of the logic circuit is decreased. That is, the row driver and the column driver need a low voltage in an input part and a high voltage in an output part.

For that reason, in the level shift circuit that converts a low voltage signal of the input part into a high voltage signal of the output part, a low amplitude signal must be converted into a high amplitude signal at a high speed.

FIG. 11 is a diagram illustrating an example of a typical configuration of a level shift circuit that converts the low amplitude signal into the high amplitude signal (refer to Japanese Unexamined Patent Publication No. 2009-188734. The level shift circuit includes p-channel MOS transistors P1 and P2 that function as charge elements of output terminals W1 and W2, n-channel MOS transistors N1 and N2 that function as discharge elements of the output terminals W1 and W2, and an inverter INV0.

The p-channel MOS transistors P1 and P2 have respective sources coupled to a high potential side supply terminal VDD3, respective gates coupled to the output terminals W2 and W1, and respective drains coupled to the output terminals W1 and W2. The p-channel MOS transistors P1 and P2 have respective gates receiving output signals OUT and OUTB of a high amplitude (VSS-VDD3) output from the output terminals W2 and W1.

The n-channel MOS transistors N1 and N2 have respective sources coupled to a low potential side supply terminal VSS, respective drains coupled to the output terminals W1 and W2, and respective gates receiving an input signal IN of a low amplitude (for example, a binary signal of a voltage sufficiently lower than VSS and VDD3), and an inversion signal thereof (both are low amplitude signals).

With the above circuit configuration, the level shift circuit outputs an inversed-phase signal OUTB of the output signal OUT having the high amplitude upon receiving the signal IN of the lower amplitude.

SUMMARY

In this example, an absolute value of a gate to source voltage VGS of the p-channel MOS transistors P1 and P2 is |VSS-VDD3| at a maximum. On the other hand, an absolute value of each gate to source voltage of the n-channel MOS transistors N1 and N2 is the amplitude of the input signal IN at a maximum. Accordingly, the discharge capacities of the n-channel MOS transistors N1 and N2 that are the discharge elements are lower than the charge capacities of the p-channel MOS transistors P1 and P2 that are the charge elements.

The drain current of the discharge elements N1, N2 and the charge elements P1, P2 is proportional to the square of, for example, "gate to source voltage–threshold value". The drain current of the charge elements P1 and P2 each having the gate to source voltage set to a large value during an on state is larger than the drain current of the discharge elements N1 and N2. Under the circumstances, in order to enhance the discharge capability of the discharge elements N1 and N2, there is a need to sufficiently increase the element size (W/L ratio where W is a channel width and L is a channel length) of the discharge elements N1 and N2.

Incidentally, the discharge capacity of the discharge elements N1 and N2 must be set to exceed the charge capacity of the charge elements P1 and P2. This can be easily understood from the viewpoint of the discharge operation.

As a specific example, let us consider a case in which, for example, the output terminals W1 and W2 are changed from states (initial states) of VDD3 (high potential) and VSS (low potential), respectively. In this state, the charge element P1 is on, and the charge element P2 is off. Also, the input signal IN is low, the discharge element N1 is off, and the discharge element N2 is on.

In this situation, when the input signal IN changes from low to high, the discharge element N1 turns on, and the discharge element N2 turns off. However, the charge element P1 is kept on immediately after the low amplitude of the input signal IN is changed from low to high. Therefore, in order that the discharge element N1 changes the output terminal W1 to low (VSS), there is a need that the discharge capacity of the discharge element N1 (the drain current of the n-channel MOS transistor N1) exceeds the charge capacity of the charge element P1 (the drain current of the p-channel MOS transistor P1).

Accordingly, in order to normally operate the level shift circuit in FIG. 11, the element size (W/L ratio) of the discharge elements N1 and N2 must be sufficiently increased, and the element size (W/L ratio) of the charge elements P1 and P2 must be sufficiently decreased so that the discharge capacity is set to exceed the charge capacity.

In this way, in the level shift circuit of FIG. 11, because there is a need to increase the size of the respective elements configuring the discharge element, there arises such a problem that the circuit area is increased. In particular, when the input signal IN is decreased in voltage, the discharge capacity of the discharge elements N1 and N2 is relatively decreased, resulting in such a problem that the circuit area is further increased.

According to an aspect of the present invention, a level shift circuit includes: first and second transistors of a first conductive type which are coupled between a first supply terminal, and first and second output terminals, respectively, and have respective control terminals receiving input signals which are relatively low in amplitude and complementary to each other; third and fourth transistors of a second conductive type which are coupled between a second supply terminal, and the first and second output terminals, respectively; a fifth transistor of the second conductive type which is coupled between a control terminal of the third transistor and the second output terminal, and has a control terminal coupled to the first output terminal; a sixth transistor of the second conductive type which is coupled between a control terminal of the fourth transistor and the first output terminal, and has a control terminal coupled to the second output terminal; a first load element which is coupled between the control terminal of the third transistor and a first voltage supply terminal, and operates to change a voltage across the control terminal of the third transistor so that the third transistor turns off; and a second load element which is coupled between the control terminal of the fourth transistor and a second voltage supply terminal, and operates to change a voltage across the control terminal of the fourth transistor so that the fourth transistor turns off, in which output signals that are relatively high in amplitude and complementary to each other are output from the first and second output terminals.

With the above circuit configuration, the low amplitude signal can be easily converted into the high amplitude signal while suppressing an increase in the circuit area.

According to the aspect of the present invention, there can be provided the level shift circuit that can easily convert the low amplitude signal into the high amplitude signal while suppressing an increase in the circuit area, and the driver circuit having such a level shift circuit.

DETAILED DESCRIPTION

Hereinafter, embodiments of the present invention will be described with reference to the accompanying drawings. Since the drawings are simplified, the technical scope of the present invention should not be narrowly interpreted on the basis of the illustration of the drawings. Also, the same elements are denoted by identical reference symbols, and repetitive description will be omitted.

First Embodiment

Figure 1:
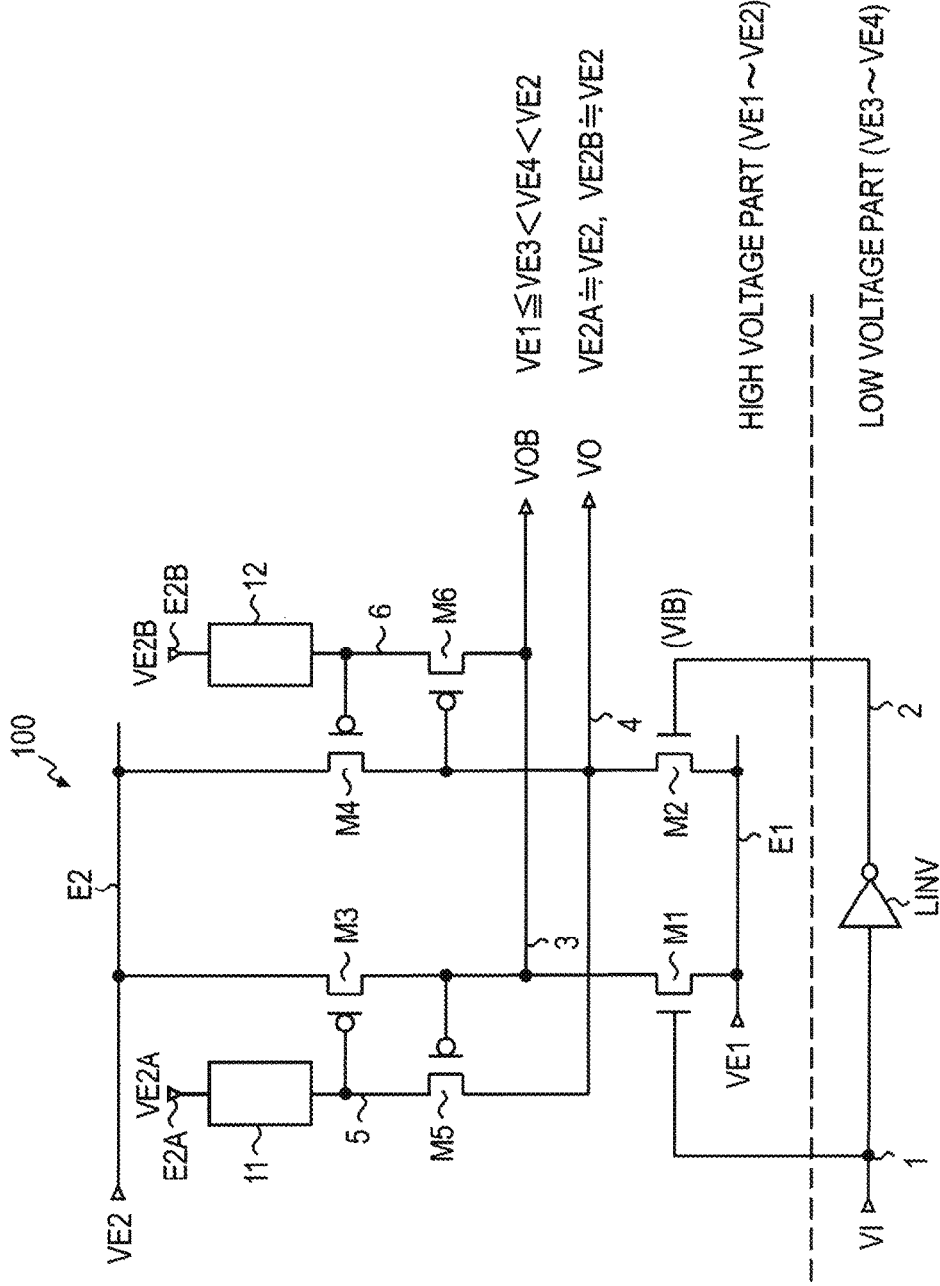
FIG. 1 is a diagram illustrating a level shift circuit according to a first embodiment of the present invention.

FIG. 1 is a diagram illustrating a level shift circuit according to a first embodiment of the present invention. The level shift circuit according to the present invention can easily convert a low amplitude signal into a high amplitude signal while suppressing an increase in a circuit area. Hereinafter, the details will be described.

A level shift circuit 100 illustrated in FIG. 1 includes an MOS transistor (first transistor, hereinafter referred to simply as "NMOS transistor") M1 of an n-channel type (first conductive type), an NMOS transistor (second transistor) M2, a MOS transistor (third transistor, hereinafter referred to simply as "PMOS transistor") M3 of a p-channel type (second conductive type), and a PMOS transistor (fourth transistor) M4. The level shift circuit 100 also includes a PMOS transistor (fifth transistor) M5, a PMOS transistor (sixth transistor) M6, a load element (first load element) 11, a load element (second load element) 12, and an inverter LINV for low amplitude.

First, the circuit configuration of the level shift circuit 100 will be described. An input signal VI and an inversion signal (input signal) VIB thereof have the amplitudes of voltage levels VE3 and VE4 (VE3<VE4), respectively, and are complementary to each other. A supply voltage VE1 at a lower potential side is applied to a supply terminal E1. A supply voltage VE2 at a higher potential side is applied to a supply terminal E2. It assumed that those voltages have a relationship of VE1≤VE3<VE4<VE2.

(NMOS Transistor M1)

The NMOS transistor M1 has a source coupled to the supply terminal E1, a drain coupled to an output node (first output terminal) 3, and a gate (control terminal) coupled to an input node 1. The NMOS transistor M1 is used as a discharge element of an output node 3, and has a drain current controlled according to a potential difference between the input signal VI of the low amplitude, which is supplied to the input node 1 from the external, and the supply voltage VE1 of the supply terminal E1. The potential of the output node 3 is output to the external as an output signal VOB.

(NMOS Transistor M2)

The NMOS transistor M2 has a source coupled to the supply terminal E1, a drain coupled to an output node (second output node) 4, and a gate (control terminal) coupled to a node 2. The node 2 is coupled to the input node 1 through the inverter LINV. That is, the potential of the node 2 is indicative of an inversion value of the potential of the input node 1. The NMOS transistor M2 is used as a discharge element of the output node 4, and a drain current controlled according to a difference potential between the inversion signal VIB of the input signal VI and the potential VE1 of the supply terminal E1. The potential of the output node 4 is output to the external as an output signal VO.

(PMOS Transistor M3)

The PMOS transistor M3 has a source coupled to the supply terminal E2, a drain coupled to the output node 3, and a gate (control terminal) coupled to a node 5. The PMOS transistor M3 is used as a charge element of the output node 3, and has a drain current controlled according to a potential difference between the potential of the node 5 and the supply voltage VE2 of the supply terminal E2.

(PMOS Transistor M4)

The PMOS transistor M4 has a source coupled to the supply terminal E2, a drain coupled to the output node 4, and a gate (control terminal) coupled to a node 6. The PMOS transistor M4 is used as a charge element of the output node 4, and has a drain current controlled according to a potential difference between the potential of the node 6 and the potential VE2 of the supply terminal E2.

(PMOS Transistors M5 and M6)

The PMOS transistor M5 has a first terminal coupled to the node 5, a second terminal coupled to the output node 4, and a gate (control terminal) coupled to the output node 3. Also, the PMOS transistor M6 has a first terminal coupled to the node 6, a second terminal coupled to the output node 3, and a gate (control terminal) coupled to the output node 4.

(Load Element 11)

The load element 11 has one terminal coupled to a voltage supply terminal E2A, and the other terminal coupled to the node 5. The load element 11 operates to change a gate voltage of the PMOS transistor M3 so that the PMOS transistor M3 turns off. A voltage VE2A of a voltage level sufficiently close to the supply voltage VE2 is applied to the voltage supply terminal E2A, and may be applied directly or indirectly (through an arbitrary element) from an arbitrary supply terminal.

(Load Element 12)

The Load element 12 has one terminal coupled to a voltage supply terminal E2B, and the other terminal coupled to the node 6. The load element 12 operates to change a gate voltage of the PMOS transistor M4 so that the PMOS transistor M4 turns off. A voltage VE2B of a voltage level sufficiently close to the supply voltage VE2 is applied to the voltage supply terminal E2B, and may be applied directly or indirectly (through an arbitrary element) from an arbitrary supply terminal.

With the above circuit configuration, the output signals VOB and VO which are relatively high in amplitude and complementary to each other are output from the output nodes 3 and 4, respectively.

Subsequently, the operation of the level shift circuit 100 will be described in detail. As an initial state, the potential of the input node 1 that receives the input signal VI is a low level (VE3) of the low amplitude, the potential of the node 2 that receives the complementary signal VIB of the input signal VI is a high level (VE4) of the low amplitude, the potential of the output node 3 is a high level (close to VE2) of the high amplitude, and the potential of the output node 4 is a low level (VE1) of the high amplitude. The nodes 5 and 6 are VE2A and VE2B, respectively. In this situation, the potentials of the NMOS transistors M1 and M2 turn off and on, respectively, and the PMOS transistors M5 and M6 turn off and on, respectively. Also, both of the PMOS transistors M3 and M4 are off. Because the PMOS transistor M6 is on, the output node 3 and the node 6 are conductive to each other.

When the input signal VI changes from the low level (VE3) of the low amplitude to the high level (VE4), the potential of the node 2 also changes from the high level (VE4) of the low amplitude to the low level (VE3), and the NMOS transistors M1 and M2 turn on and off, respectively. Upon turning on the NMOS transistor M1, the potential of the output node 3 drops from the high level (close to VE2). When the potential of the output node 3 falls below the on-level (VE2A−|Vtp5|) of the PMOS transistor M5, the PMOS transistor M5 turns on (a state in which a gate to source voltage is still small), and the potential of the node 5 changes from the high level (VE2A) to a potential following the potential drop of the output node 3 (a potential higher than the output node 4 by an absolute value |Vtp5| of the threshold voltage of the PMOS transistor M5). When the drain (output node 4) of the PMOS transistor M5 is low level in the potential, the PMOS transistor M3 does not turn on until the potential of the output node 3 falls below (VE2−|Vtp3|−|Vtp5|). Vtp3 and Vtp5 are the respective threshold voltages of the PMOS transistors M3 and M5.

On the other hand, with the potential drop of the output node 3, the potential of the node 6 drops in conformity with the output node 3 (to the same potential) through the PMOS transistor M6 of on state (a state in which the gate to source voltage is large). When the potential of the output node 3 (node 6) falls below the on-level (VE2−|Vtp4|) of the PMOS transistor M4, the PMOS transistor M4 turns on, and the potential of the output node 4 rapidly rises from the low level (VE1) to about VE2 of the high level. Vtp4 is a threshold voltage of the PMOS transistor M4.

With the rising potential of the output node 4, the PMOS transistor M6 turns off, and the potential drop of the node 6 stops. On the other hand, because of the potential drop of the output node 3 and the potential rising of the output node 4, the PMOS transistor M5 turns on (a state in which the gate to source voltage is large). In this situation, the node 5 is rendered conductive to the output node 4 through the PMOS transistor M5 of the on state, and the potential of the node 5 rapidly rises to about VE2 in conformity with the potential rising of the output node 4. For that reason, the PMOS transistor M3 rapidly returns to the off state even if the PMOS transistor M3 becomes slightly on due to the potential drop of the output node 3. The potential of the output node 3 drops down to the low level (VE1) due to the NMOS transistor M1 of the on state.

The load elements 11 and 12 have the operation of charging the gates (nodes 5 and 6) of the PMOS transistors M3 and M4 with the help of currents supplied from the voltage supply terminals E2A and E2B, respectively. The output node 4 pulled up to about VE2 by the aid of the charging operation of the PMOS transistor M4 is held at a potential (for example, VE2A) close to VE2 by the aid of the charging operation of the load element 11 through the PMOS transistor M5 of the on state. On the other hand, the node 6 is pulled up to a potential (for example, VE2B) close to VE2 by the aid of the charging operation of the Load element 12, and the PMOS transistor M4 turns off.

Because the level shift circuit 100 in FIG. 1 is of a symmetrical configuration, the operation when the input signal VI changes from the high level (VE4) of the low amplitude to the low level (VE3) is identical with the operation when the complementary signal VIB of the input signal changes from the low level (VE3) to the high level (VE4), and the above description of the operation is referred to.

In this way, in the level shift circuit 100 according to this embodiment, in the output stable state, one of the NMOS transistors M1 and M2 of the discharge elements turns on, both of the PMOS transistors M3 and M4 of the charge elements turn off, and the output node of the high level of the high amplitude is held by the charging operation of the load element 11 or 12. Accordingly, the discharging operation of the output nodes 3 and 4 is executed if the discharge capacity of the NMOS transistors M1 and M2 exceeds the charge capacity of the load elements 11 and 12. For that reason, the load elements 11 and 12 are set so that the operation of charging the gates (nodes 5 and 6) of the PMOS transistors M3 and M4 is relatively small, or the charging operation is temporarily suspended in change timing of the input signal VI. With this operation, the level shift circuit 100 according to this embodiment can easily convert the low amplitude signal into the high amplitude signal even if the input signals VI and VIB supplied to the gates of the NMOS transistors M1 and M2 are of the low amplitude.

Also, in the level shift operation of the output nodes 3 and 4, for example, when the NMOS transistor M1 changes from off to on, even if the PMOS transistor M3 coupled in series with the NMOS transistor M1 transiently slightly turns on, the PMOS transistor M3 has no charging operation that interferes with the discharging operation of the NMOS transistor M1. For that reason, the potential of the output node 3 promptly drops from the high level (VE2) of the high amplitude to the low level (VE1) by the aid of the discharging operation of the NMOS transistor M1. In this situation, there is substantially no current consumption transiently flowing between the power supplies (E2-E1) through the PMOS transistor M3 and the NMOS transistor M1. Also, a current in the Load element 12 that holds the potential of the output node 3 at the high level (close to VE2) through the PMOS transistor M6 also transiently flows between the power supplies (E2B-E1) through the NMOS transistor M1, but is sufficiently small. The above description is applied to a case in which the NMOS transistor M1 changes from on to off.

On the other hand, the PMOS transistor M4 coupled in series with the NMOS transistor M2 that changes from on to off turns on when the potential of the output node 3 drops, and promptly pulls the potential of the output node 4 up to the high level (close to VE2). When the potential of the output node 4 changes to the high level, the transient current consumption between the power supplies (E2-E1) is interrupted due to the operation of the PMOS transistors M5 and M6, and does not occur in the output stable state. The above description is also applied to a case in which the NMOS transistor M2 turns from off to on.

Also, when the voltage supply terminal voltages VE2A and VE2B are slightly lower than the supply voltage VE2, the potential of the high level of the output nodes 3 and 4 is also slightly lower than the supply voltage VE2. However, there arises no problem if the nodes 5 and 6 are held at potentials allowing the PMOS transistors M3 and M4 to sufficiently turn off. That is, there is no difficulty in the operation of the digital circuit coupled downstream of the level shift circuit 100.

Figure 11:
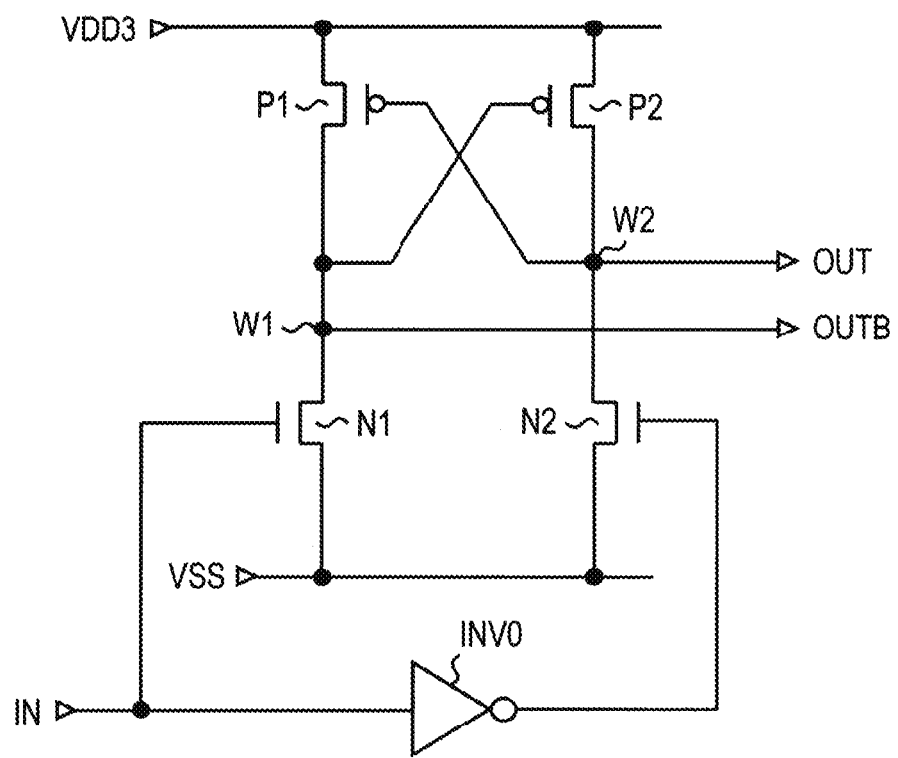
FIG. 11 is a diagram illustrating a level shift circuit in a related art.

In the related art illustrated in FIG. 11, when the W/L ratio of the discharge elements N1 and N2 is set to be larger, the level shift operation is slow due to an increase in the parasitic capacity, and there is a possibility that a period during which the elements N1 and P1 are on at the same time, or the element N2 and P2 are on at the time state are lengthened. As a result, there arises such a problem that a through-current transiently flows is increased so that the power consumption increases. In particular, this problem is actualized when the voltage amplitude of the input signal IN lowers, but there is a limit to increase the element size for the purpose of solving this problem.

On the other hand, in the level shift circuit 100 according to this embodiment, as described above, the PMOS transistors M5 and M6 conduct the switching operation of controlling couplings between the gates of the PMOS transistors M3 and M4 of the charge elements and the output nodes 4 and 3 to be rendered conductive or nonconductive according to the voltage levels of the output nodes 3 and 4, respectively. For that reason, a moment when the discharging NMOS transistors M1, M2 and the charging PMOS transistors M3, M4, which are coupled in series, are on at the same time hardly occurs in the process of the level shift operation. As a result, the level shift circuit 100 according to this embodiment can realize the high-speed level shift operation with the low power consumption.

Also, in the level shift circuit 100 according to this embodiment, the gate to source voltage (corresponding to the charge capacity) of the PMOS transistors M3 and M4 is automatically controlled in timing of an on/off change of the PMOS transistors M5 and M6, and does not depend on the amplitude (high potential side supply voltage: VE2) of the output signals VO and VOB. For that reason, there is no need to remarkably adjust the element size due to the magnitude of the high potential side supply voltage (VE2). That is, in the level shift circuit 100 according to this embodiment, unlike the related art, there is no need to adjust the element size so that the discharge capacity of the NMOS transistors M1 and M2 sufficiently exceeds the charge capacity of the charge elements P1 and P2. Therefore, the design is easy.

Also, in the level shift circuit 100 according to this embodiment, the PMOS transistors M3 to M6 can be configured with the minimum sizes in both of a channel width W and a channel length L. The NMOS transistors M1 and M2 can be configured with the minimum size of the channel length L, and a size slightly larger than the minimum size in the channel width W. Also, when the load elements 11 and 12 are configured by current source transistors (FIG. 4), diode-coupled transistors (FIG. 5), or switch transistors (FIG. 6), the size of the load elements 11 and 12 can be sufficiently reduced. As a result, the level shift circuit 100 according to this embodiment can suppress an increase in the circuit area.

The load elements 11 and 12 may conduct the minimum charging operation necessary for pulling up the potential of the gates of the PMOS transistors M3 and M4 to an off level and for holding the output node (3 or 4) of the high level (VE2) in the output stable state. Accordingly, the load elements 11 and 12 can be configured by resistive elements (FIG. 3), the current sources (FIG. 4), or the diode-coupled transistors (FIG. 5). Alternatively, the load elements 11 and 12 can be configured by the switch transistors (FIGS. 6 and 7) that turn off during the level shift operation of the output nodes 3 and 4, and turn on during the output stable state.

Second Embodiment

Figure 2:
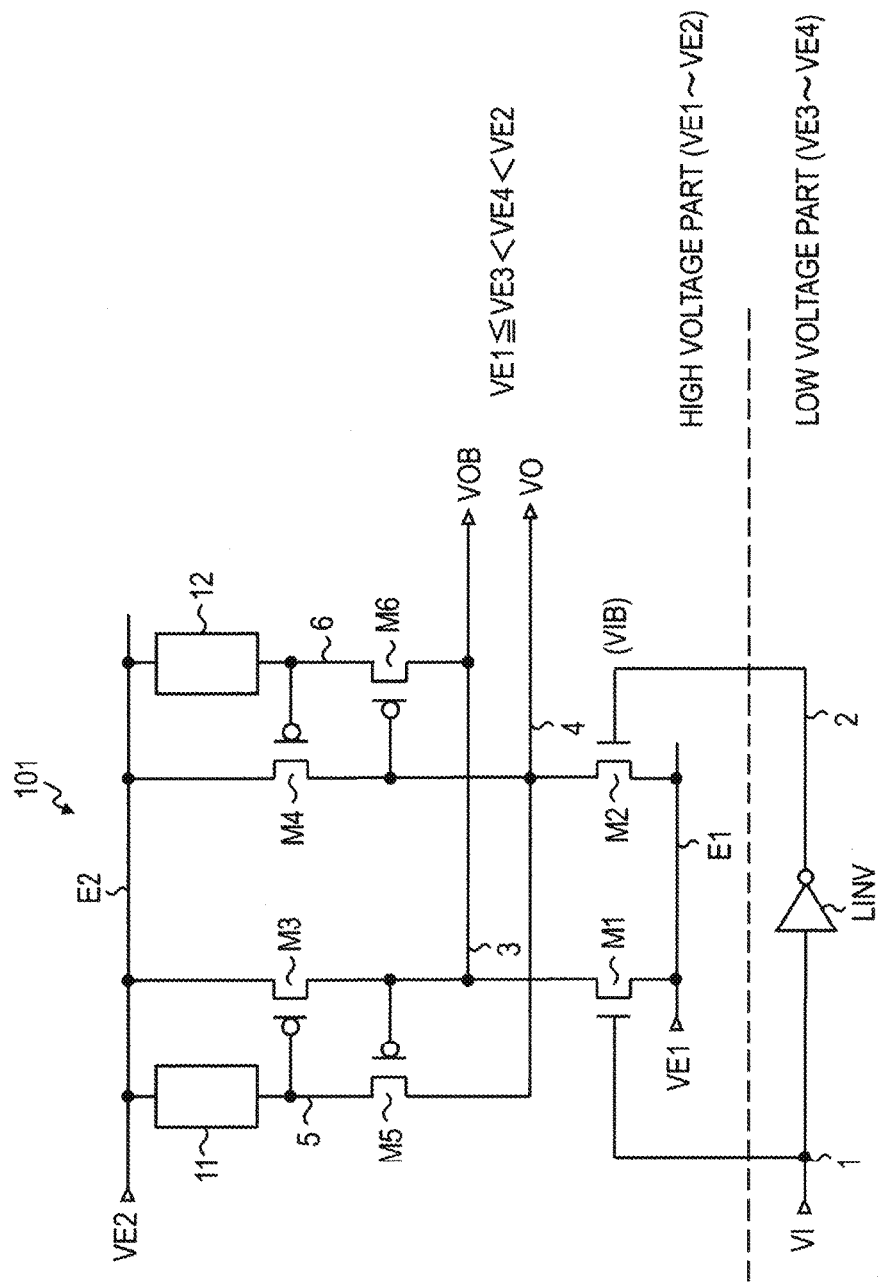
FIG. 2 is a diagram illustrating a level shift circuit according to a second embodiment of the present invention.

FIG. 2 is a diagram illustrating a level shift circuit according to a second embodiment of the present invention. In a level shift circuit 101 illustrated in FIG. 2, as compared with the level shift circuit 100 illustrated in FIG. 1, the voltage supply terminals E2A and E2B are identical with the supply terminal E2. The configurations and operation of the level shift circuit 101 and the other circuits are identical with those of the level shift circuit 100 illustrated in FIG. 1, and therefore their description will be omitted. Hereinafter, examples (specific examples) of the load elements 11 and 12 will be described with reference to FIGS. 3 to 6.

Figure 3:
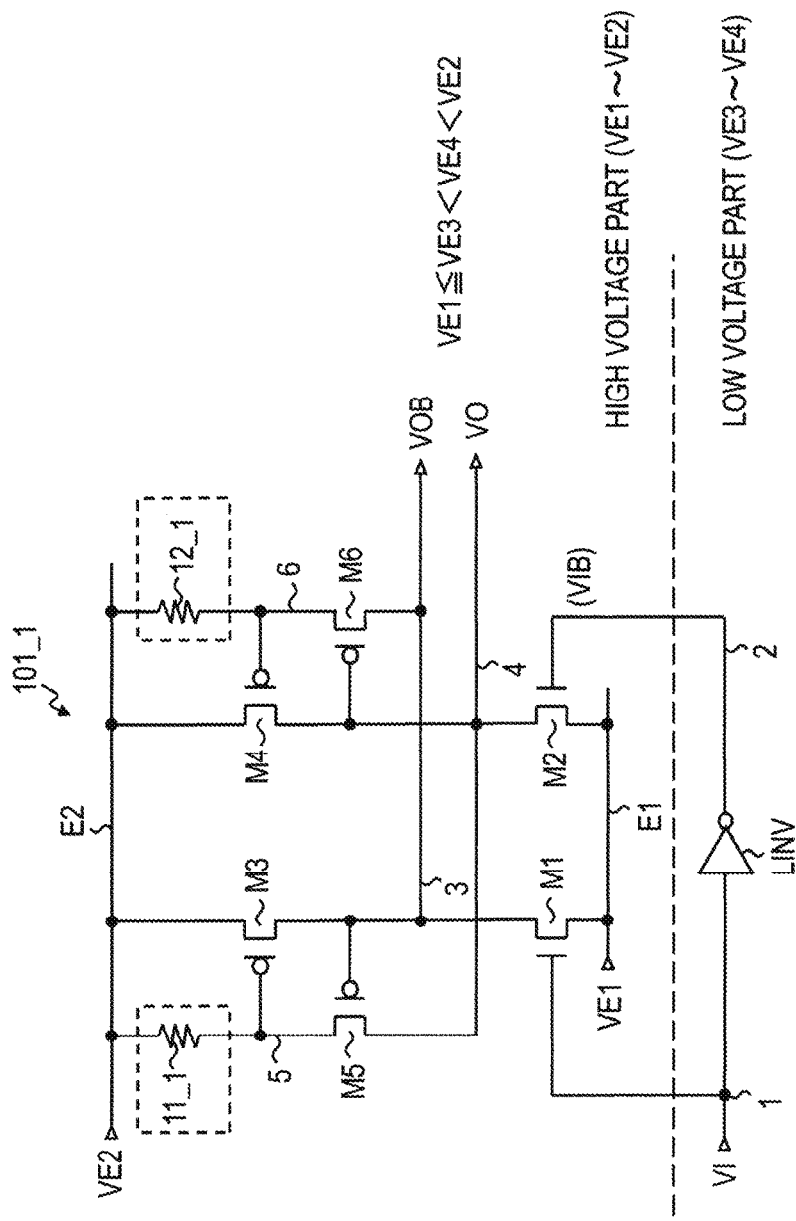
FIG. 3 is a diagram illustrating one specific example of a level shift circuit according to the second embodiment of the present invention.

FIG. 3 illustrates an example in which the load elements 11 and 12 are configured by resistive elements 11_1 and 12_1, respectively, in the level shift circuit 101 illustrated in FIG. 2. In a level shift circuit 101_1 illustrated in FIG. 3, one end of the load element 11_1 is coupled to the supply terminal E2, and the other end thereof is coupled to the node 5. One end of the load element 12_1 is coupled to the supply terminal E2, and the other end thereof is coupled to the node 6.

The level shift circuit 101_1 conducts the level shift operation without receiving a control signal from the external. The load elements 11_1 and 12_1 are set to resistance values so as to relatively reduce the operation of charging the gates (nodes 5, 6) of the PMOS transistors M3 and M4. The potentials of the nodes 5 and 6 are held at the supply voltage VE2 in the output stable state by the load elements 11_1 and 12_1, respectively.

Figure 4:
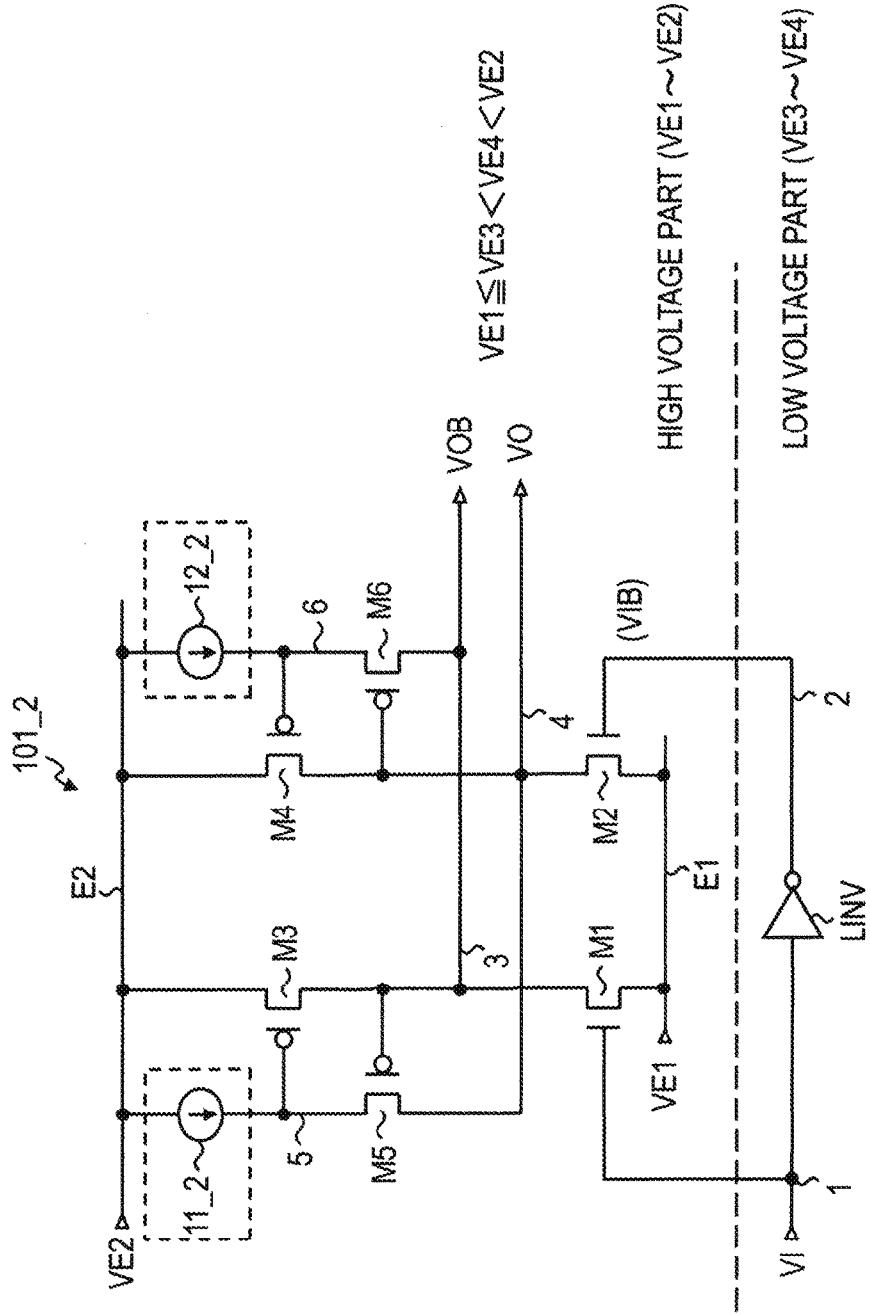
FIG. 4 is a diagram illustrating another specific example of a level shift circuit according to the second embodiment of the present invention.
Figure 5:
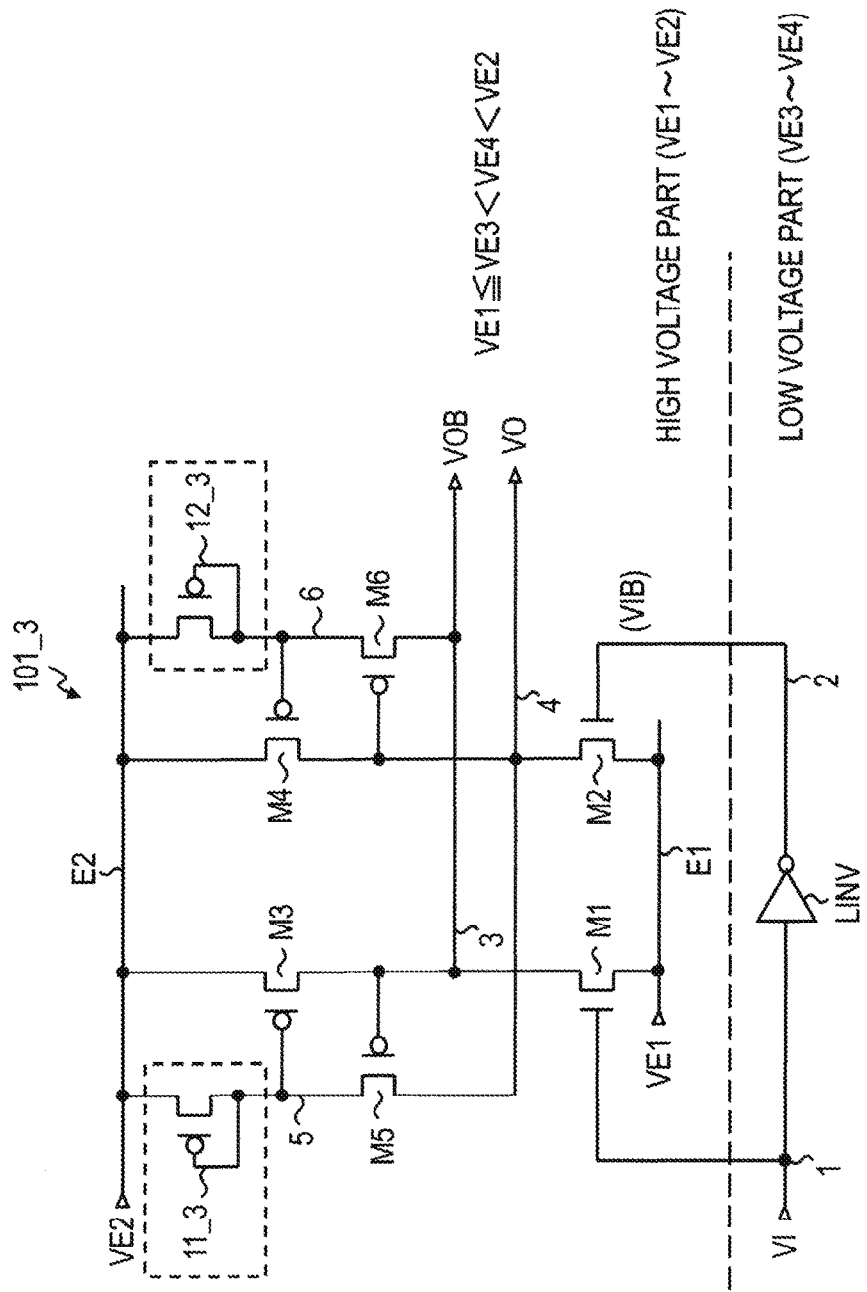
FIG. 5 is a diagram illustrating still another specific example of a level shift circuit according to the second embodiment of the present invention.

FIG. 4 illustrates an example in which the load elements 11 and 12 are configured by current sources 11_2 and 12_2, respectively, in the level shift circuit 101 illustrated in FIG. 2. In a level shift circuit 101_2 illustrated in FIG. 4, an input terminal of the current source 11_2 is coupled to the supply terminal E2, and an output terminal thereof is coupled to the node 5. An input terminal of the current source 12_2 is coupled to the supply terminal E2, and an output terminal thereof is coupled to the node 6.

The level shift circuit 101_2 conducts the level shift operation without receiving a control signal from the external. The current sources 11_2 and 12_2 are set to current values so as to relatively reduce the operation of charging the gates (nodes 5, 6) of the PMOS transistors M3 and M4, respectively. The potentials of the nodes 5 and 6 are held at the supply voltage VE2 in the output stable state by the current sources 11_2 and 12_2, respectively.

The current sources 11_2 and 12_2 may be configured by current source transistors having respective gates applied with a given bias voltage. In the case of FIG. 4, the current sources 11_2 and 12_2 can be configured by PMOS transistors having respective sources coupled to the supply terminal E2, respective drains coupled to the nodes 5 and 6, and gates applied with a given bias voltage.

Figure 9:
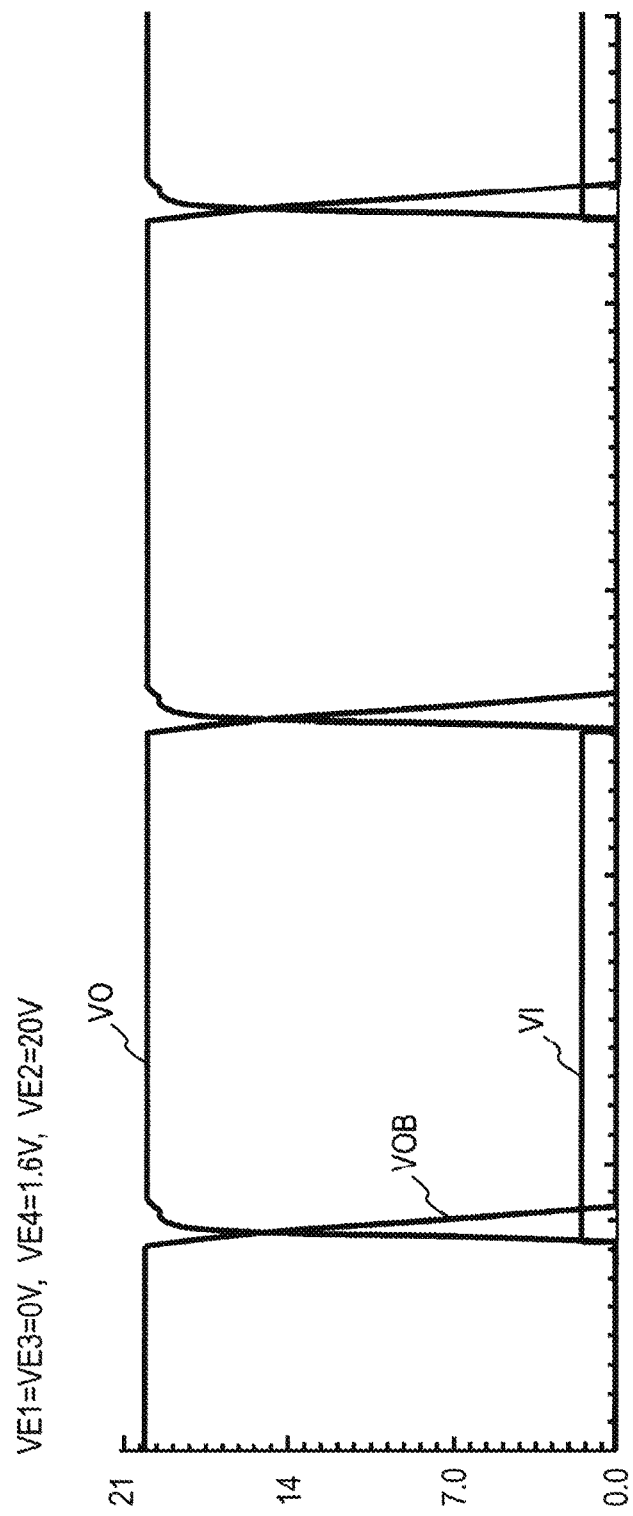
FIG. 9 is a timing chart illustrating the operation of the level shift circuit illustrated in FIG. 4.

FIG. 9 is a diagram illustrating a simulation waveform of the level shift circuit 101_2 of FIG. 4. Referring to FIG. 9, a description will be given of an example in which the input signal VI is a pulse signal that is 0V to 1.6V (VE3=0V, VE4=1.6V) in amplitude and 1 us in period, and the output signals VO and VOB are signals that are 0V to 20V (VE1=0V, VE2=20V) in amplitude.

It can be confirmed from FIG. 9 that, in the level shift circuit 101_2, the output signal VO (voltage waveform of the output node 4) and the VOB (voltage waveform of the output node 3) are promptly changed according to a change in the voltage level of the input signal VI having the low amplitude. That is, it can be confirmed from FIG. 9 that the level shift circuit 101_2 conducts the level shift operation at a high speed. When the level shift circuit of the relate art (FIG. 11) is configured by transistors of the size at which the circuit area is not excessive, the prompt level shift operation illustrated in FIG. 9 is not conducted.

FIG. 5 illustrates an example in which the load elements 11 and 12 are configured by diode-coupled transistors 11_3 and 12_3, respectively, in the level shift circuit 101 illustrated in FIG. 2. In a level shift circuit 101_3 illustrated in FIG. 5, the diode-coupled transistor 11_3 has a source coupled to the supply terminal E2, and a drain and a gate commonly coupled to the node 5. The diode-coupled transistor 12_3 has a source coupled to the supply terminal E2, and a drain and a gate commonly coupled to the node 6.

The level shift circuit 101_3 conducts the level shift operation without receiving a control signal from the external. The diode-coupled transistors 11_3 and 12_3 are set to element sizes so as to relatively reduce the operation of charging the gates (nodes 5, 6) of the PMOS transistors M3 and M4, respectively. The potentials of the nodes 5 and 6 are held at the potentials at which the PMOS transistors M3 and M4 turn off in the output stable state, respectively.

The diode-coupled transistors 11_3 and 12_3 turn off when an absolute value of the gate to source voltage becomes lower than the absolute value of the threshold voltage. Accordingly, the potentials of the nodes 5 and 6 remain at potentials slightly lower than the supply voltage VE2 without rising up to the supply voltage VE2. For that reason, the output node (3 or 4) of the high level becomes a potential slightly lower than the supply voltage VE2. However, since the PMOS transistors M3 and M4 are off, the current consumption does not increase. Also, even when a digital circuit that operates with a high amplitude (VE1-VE2) is coupled downstream of the output nodes 3 and 4, there is no difficulty in the operation of the digital circuit.

The operation of the diode-coupled transistors 11_3 and 12_3 in the level shift circuit 101_3 is identical with the operation when the voltage supply terminal voltages VE2A and VE2B in the level shift circuit 100 of FIG. 1 are slightly lower than the supply voltage VE2 (for example, a case in which the load elements 11 and 12 are configured by the resistive elements or the current sources) in that the potentials of the high level of the nodes 5, 6 and the output nodes 3, 4 remain at potentials slightly lower than the supply voltage VE2.

Figure 6:
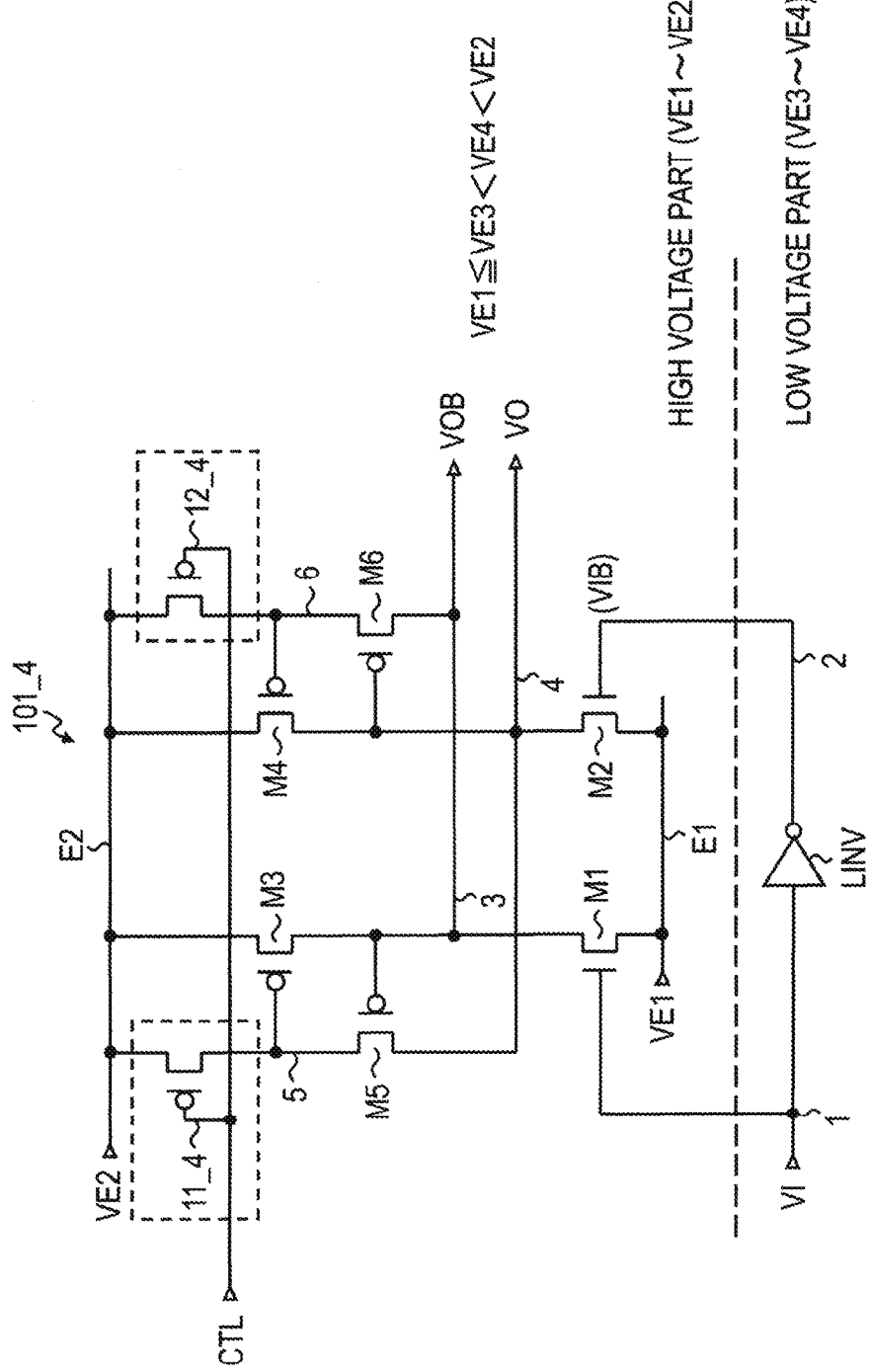
FIG. 6 is a diagram illustrating yet still another specific example of a level shift circuit according to the second embodiment of the present invention.

FIG. 6 illustrates an example in which the load elements 11 and 12 are configured by p-channel type switch transistors 11_4 and 12_4, respectively, in the level shift circuit 101 illustrated in FIG. 2. In a level shift circuit 101_4 illustrated in FIG. 6, the switch transistor 11_4 has a source coupled to the supply terminal E2, and a drain coupled to the node 5, and a gate supplied with a control signal CTL from the external. The switch transistor 12_4 has a source coupled to the supply terminal E2, a drain coupled to the node 6, and a gate supplied with the control signal CTL. That is, the on/off operation of the switch transistors 11_4 and 12_4 is controlled according to the control signal CTL.

The level shift circuit 101_4 conducts the level shift operation upon receiving the control signal CTL from the external. Both of the switch transistors 11_4 and 12_4 are controlled to be off during a given period including timing where the logical value of the input signal VI can be changed, and controlled to be on during a period other than the given period (output stable period), according to the control signal CLT. As a result, during the given period where the logical value of the input signal VI can be changed, the operation of charging the nodes 5 and 6 is stopped, and the current consumption that transiently occurs is blocked. Therefore, high-speed level shift operation and the low power consumption can be realized. Also, during the period other than the given period (output stable period), the operation of charging the nodes 5 and 6 is restarted, and the output node (3 or 4) of the high level (VE2) is stably held. In this situation, even if the operation of charging the nodes 5 and 6 is set to the stronger charging operation, the level shift operation is not affected by the charging operation. That is, in the configuration of the level shift circuit 101_4 illustrated in FIG. 6, as compared with the configurations of FIGS. 3 to 5, the level shift operation is increased in processing speed, and the capability of suppressing a fluctuation of the voltage level attributable to coupling noise from a peripheral circuit or the external is enhanced.

Figure 7:
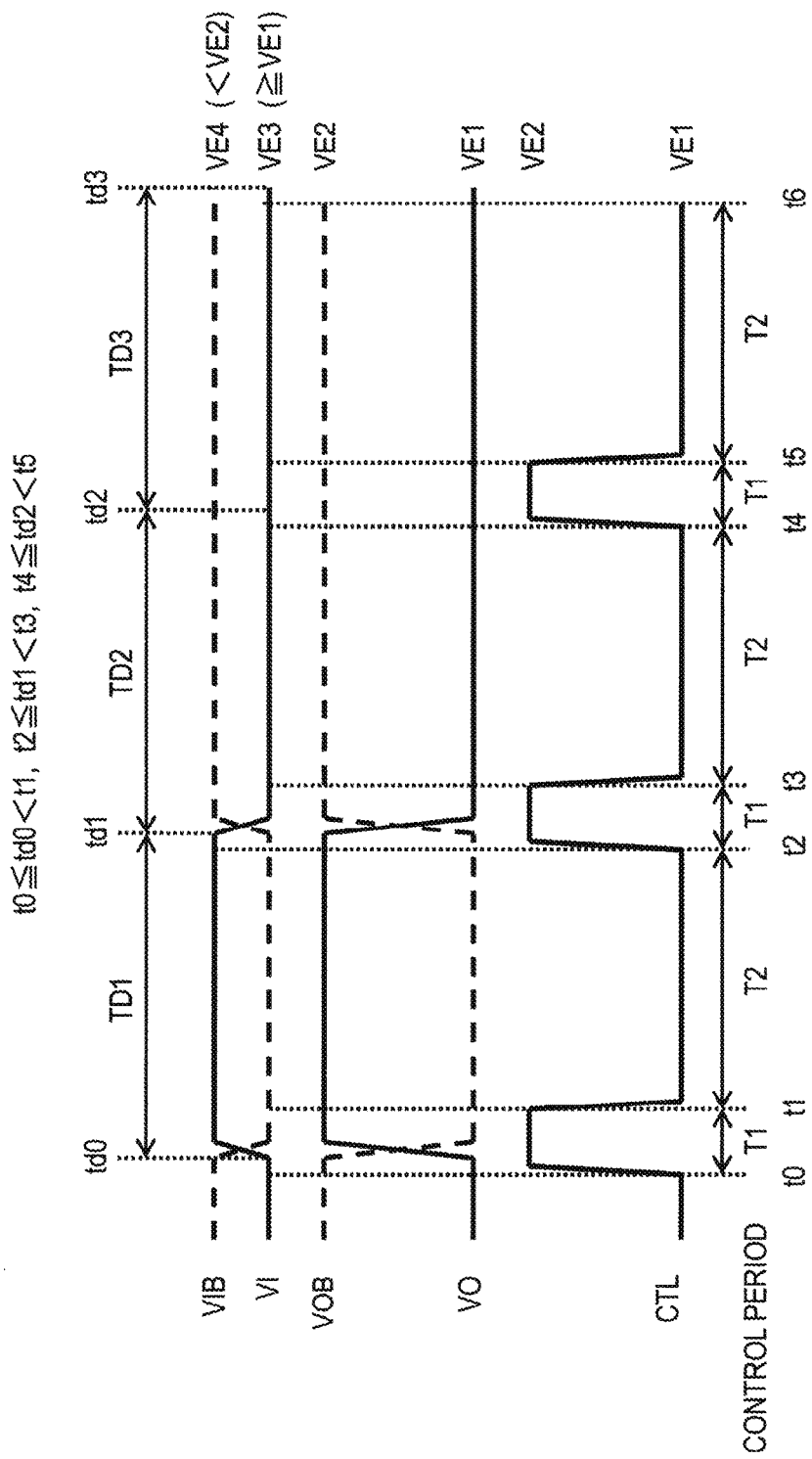
FIG. 7 is a timing chart illustrating the operation of the level shift circuit illustrated in FIG. 6.

FIG. 7 is a timing chart of the input signal VI, the input complementary signal VIB, the output signal VO, the output complementary signal VOB, and the control signal CTL in the level shift circuit 101_4 of FIG. 6. As the input signal VI, a data signal of the low amplitude is input in a given period. Referring to FIG. 7, a description will be given of an example in which the data signals of high level, low level, and low level are input as the input signal VI during three data periods TD1, TD2, and TD3, and the data signal of the low level is input before the data period TD1.

Both of the switch transistors 11_4 and 12_4 are controlled to be off during a given period T1 (t0 to t1, t2 to t3, t4 to t5) including timing (start timing td0, td1, td2 of the respective data periods) where the logical value of the input signal VI can be changed, and controlled to be on during a subsequent output stable period T2, according to the control signal CLT.

A start time of the period T1 is set to a start timing (td0, td1, td3) of the data period, or before the start timing. An end time (start time of the period T2) of the period T1 is set to a time when the level shift operation of the output nodes 3 and 4 has been substantially completed. In other words, the end time of the period T1 is set to a time when the potential of the output node (3 or 4) which is changed to the high level arrives at the vicinity of the voltage VE2. Accordingly, relationships of t0≤td0<t1, t2≤td1<t3, and t4≤td2<t5 are satisfied.

In the period T1, the switch transistors 11_4 and 12_4 are off, and the operation of charging the nodes 5 and 6 is stopped to block the current consumption that transiently occurs. Therefore, the high-speed level shift operation and the low power consumption can be realized. In the period T2, the switch transistors 11_4 and 12_4 are on, and the output node (3 or 4) and the nodes 5 and 6 are stably held at the high level (VE2).

The timing of changing the logical value of the control signal CTL does not affect the level shift timing of the output signals VO and VOB. That is, within the period T1 where the switch transistors 11_4 and 12_4 are off, the level shift operation is conducted at a high speed in the timing of changing the logical value of the input signal VI. Accordingly, the voltage level of the control signal CTL may be gently changed (except for a case where the start time of the period T1 is the same time as td0, td1, and td2). For that reason, the buffer circuit that outputs the control signal CTL may be configured by a transistor relatively small in size. With this configuration, an increase in the circuit scale is suppressed, and the EMI is reduced.

Third Embodiment

Figure 8:
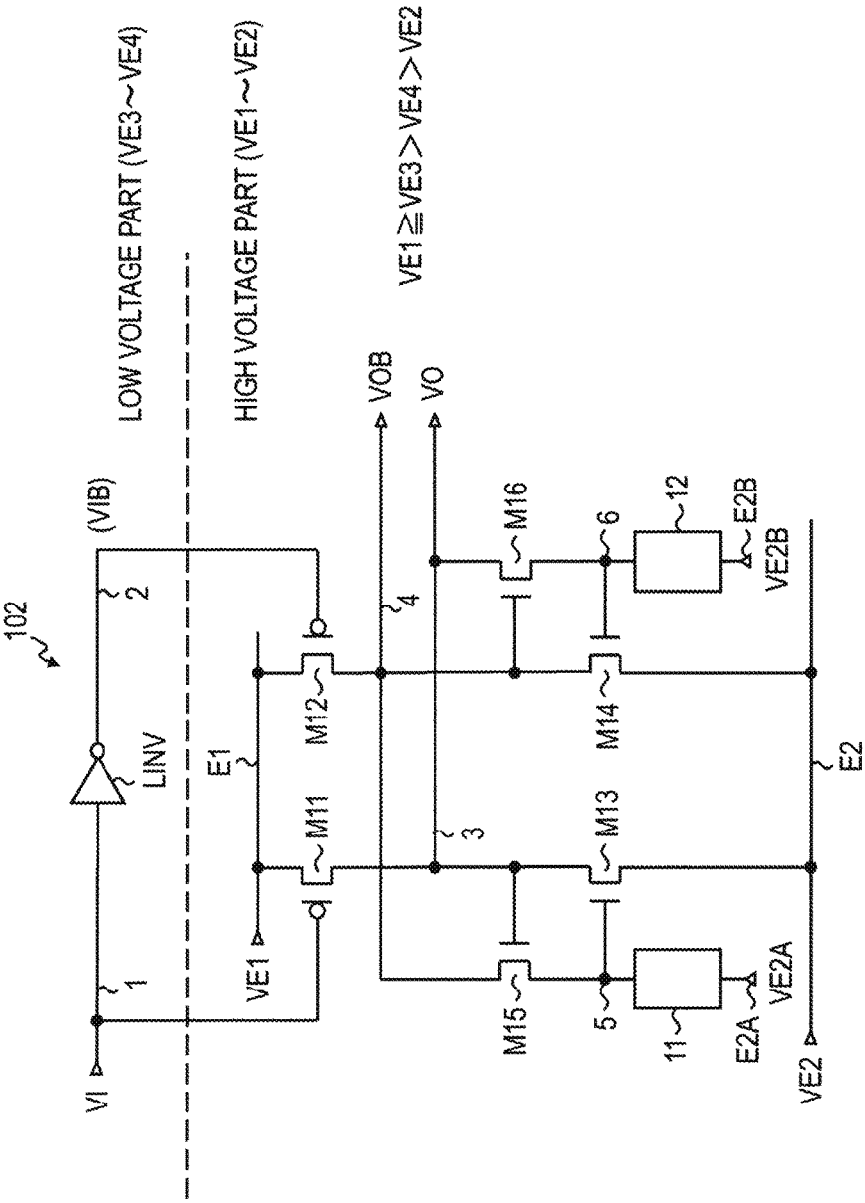
FIG. 8 is a diagram illustrating a level shift circuit according to a third embodiment of the present invention.

FIG. 8 is a diagram illustrating a level shift circuit according to a third embodiment of the present invention. In a level shift circuit 102 illustrated in FIG. 8, as compared with the level shift circuit 100 illustrated in FIG. 1, the conductive types of the respective transistors are changed. In more detail, the NMOS transistors M1 and M2 are replaced with PMOS transistors M11 and M12, respectively, and the PMOS transistors M3 to M6 are replaced with NMOS transistors M13 to M16, respectively. In more detail, the respective transistors are so changed as to satisfy a relationship of VE1≥VE3>VE4>VE2. The other circuit configurations and operation of the level shift circuit 102 are identical with those of the level shift circuit 100 illustrated in FIG. 1 in principle although the charging operation and the discharging operation of the output terminals are reversed with the change in the conductive types of the respective transistors and the reverse of the magnitude of the supply voltages. Therefore, repetitive description will be omitted.

The level shift circuit 102 receives the input signal VI of the low amplitude (VE3 to VE4), and outputs the output signal VO and the complementary signal VOB of the amplitudes (VE1 to VE2) enlarged toward the low potential side. The same changes as the changes from FIG. 1 to FIGS. 2 to 6 can be also conducted on FIG. 8.

Fourth Embodiment

Figure 10:
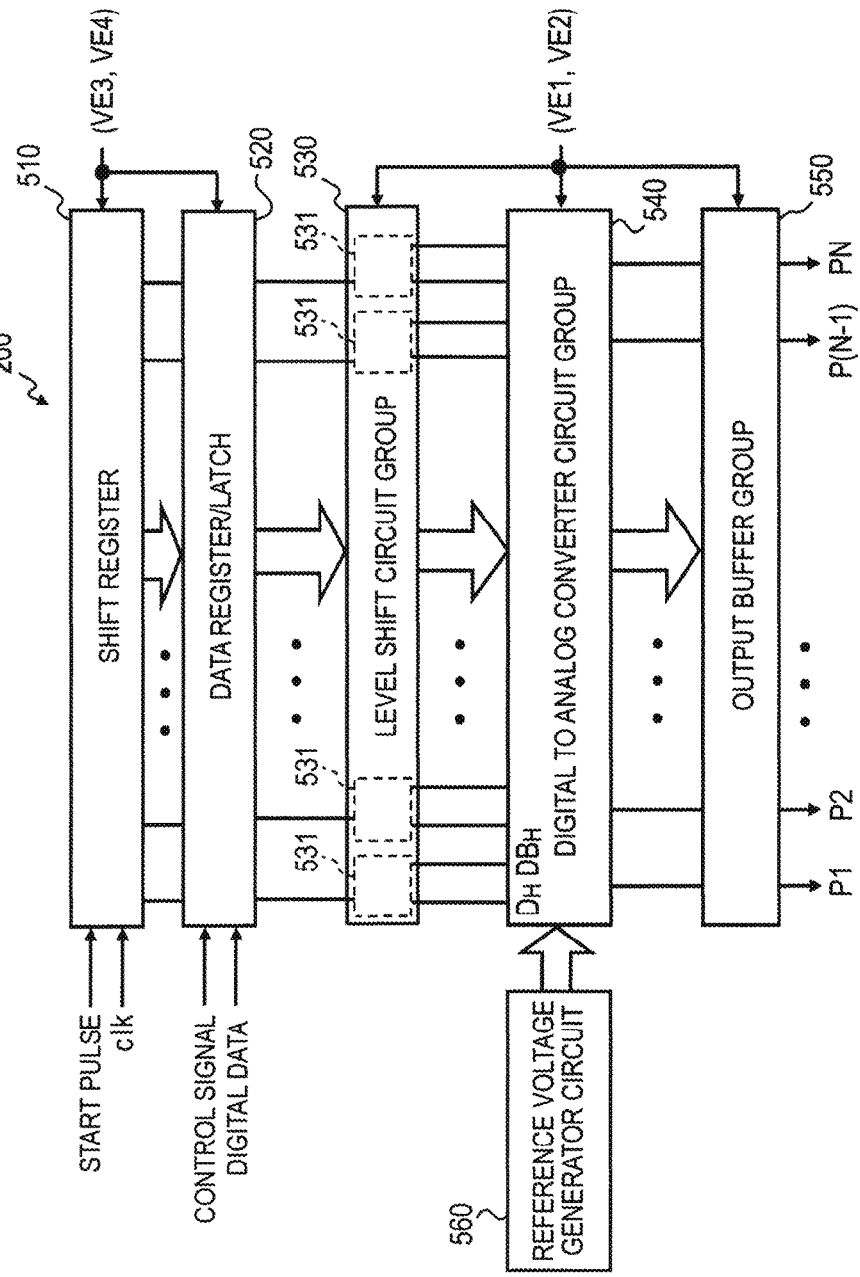
FIG. 10 is a diagram illustrating a column driver according to a fourth embodiment of the present invention.

FIG. 10 is a diagram illustrating an example of a configuration of a column driver (driver circuit) used in a display device according to a fourth embodiment of the present invention. FIG. 10 illustrates an example in which the level shift circuit of the present invention is applied to a level shift circuit of a multi-output driver.

Referring to FIG. 10, a column driver 200 includes a shift register 510, a data register/latch 520, a level shift circuit group 530, a digital to analog converter circuit group 540, an output buffer group 550, and a reference voltage generator circuit 560.

The shift register 510 is a circuit that generates a latch timing signal for selection of a latch address in synchronism with a clock signal clk. The data register/latch 520 is a circuit that latches digital data, and outputs the digital data as an output data signal on the basis of an output (latching timing signal) from the shift register 510. The level shift circuit group 530 includes a plurality of level shift circuits 531 that each receive the output data signal from each stage of the data register/latch 520, and conduct the level shift.

The digital to analog converter circuit group 540 includes a plurality of digital to analog converter circuits each receiving an output signal (video data) of the level shift circuit group 530, and reference voltages different in level from each other from the reference voltage generator circuit 560, and selectively outputting the reference voltage corresponding to the video data. The output buffer group 550 is a circuit that receives the reference voltage selected by the digital to analog converter circuit group 540, and outputs a grayscale voltage signal corresponding to the video data to data lines of the display device.

The shift register 510 and the data register/latch 520 are applied with supply voltages (VE3, VE4) of the low amplitude. The level shift circuit group 530, the digital to analog converter circuit group 540, and the output buffer group 550 are applied with the supply voltages (VE1, VE2) of the high amplitude.

In the configuration illustrated in FIG. 10, the plural level shift circuits 531 included in the level shift circuit group 530 can be configured by a level shift circuit described, for example, with reference to FIGS. 1 to 5, as the level shift circuits 531, which each receive the output signal of the low amplitude from the data register/latch 520, and output the output signals, which are complementary to each other, of the high amplitude. The inverter LINV for low amplitude may be incorporated into the data register/latch 520 side. Also, if a circuit for generating the control signal CTL is added, the level shift circuit described with reference to FIG. 6 can be used as those level shift circuits 531. In this way, the column driver (driver circuit) according to this embodiment is applied to the level shift circuit of the present invention, thereby enabling the low power consumption and the high-speed operation to be realized. Also, a reduction in the costs caused by area saving can be also realized.

The present invention is not limited to the above embodiments, and can be appropriately changed without departing from the subject matter of the present invention.

What is claimed is:

1. A method of converting an input signal having a low amplitude into an output signal having a high amplitude, comprising:
    activating a first NMOS transistor and inactivating a second NMOS transistor in response to the changing of the voltage level of the input signal;
    dropping a voltage potential of a first output node coupled to a first PMOS transistor and a second load circuit;
    activating a second PMOS transistor by the second load circuit;
    raising a second output node by charging operation of the second PMOS transistor;
    inactivating the second PMOS transistor by charging operation of the second load circuit;
    inactivating the first PMOS transistor and the second PMOS transistor at an output stable state at which the voltage potential of the second output node is high; and
    holding the voltage potential of the second output node by a first load circuit at the output stable state.

2. The method according to claim 1, wherein the first output node is coupled between the first PMOS transistor and the first NMOS transistor.

3. The method according to claim 1, further comprising:
activating the second NMOS transistor in response to the changing of the voltage level of the input signal;
dropping a voltage potential of the second output node by a voltage supplied from the second NMOS transistor;
inactivating the second PMOS transistor at the output stable state; and
holding the voltage potential of the first output node by the second load circuit at the output stable state.

4. The method according to claim 3, wherein the second output node is coupled between the second PMOS transistor and the second NMOS transistor.

5. The method according to claim 3, wherein the second output node is coupled with the first load circuit.

6. The method according to claim 3, wherein the voltage potential of the first output node and the voltage potential of the second output node are complementary to each other.

7. A voltage level shifting method comprising:
inputting an input signal having a high amplitude;
operating a pair of PMOS transistors and a pair of NMOS transistors in accordance with the input signal;
generating a pair of complementary output signals having a high amplitude by the operating the pair of the PMOS transistors and the pair of the NMOS transistors;
inactivating the pair of the PMOS transistors at a same output state;
holding voltage potentials of the complementary output signals charging operation by a load circuit; and
outputting the complementary output signals.

8. The voltage level shifting method according to claim 7, wherein the holding comprises:
charging gates of the PMOS transistors by the load circuit.

9. The voltage level shifting method according to claim 8, wherein the holding further comprises:
returning the voltage potentials of the complementary output signals by the load circuit if the voltage potential of one of the complementary output signals drops off.

* * * * *